United States Patent [19]

Kamiya et al.

[11] Patent Number: 4,902,900
[45] Date of Patent: Feb. 20, 1990

[54] DEVICE FOR DETECTING THE LEVELLING OF THE SURFACE OF AN OBJECT

[75] Inventors: Saburo Kamiya; Hideo Mizutani, both of Yokohama, Japan

[73] Assignee: Nikon Corporation, Tokyo, Japan

[21] Appl. No.: 284,659

[22] Filed: Dec. 15, 1988

[30] Foreign Application Priority Data

Dec. 21, 1987 [JP] Japan ................................. 62-321585
Mar. 22, 1988 [JP] Japan ................................. 63-67518

[51] Int. Cl.⁴ .......................... G01N 21/86; G01N 9/04
[52] U.S. Cl. ..................................... 250/548; 250/561; 356/400
[58] Field of Search .......... 250/548, 557, 561, 231 SE; 356/400, 401

[56] References Cited

U.S. PATENT DOCUMENTS 4,558,949 12/1985 Uehara et al. ......................... 356/152
4,693,615 9/1987 Kyriakis ............................... 250/548
4,770,531 9/1988 Tanaka et al. ......................... 356/358
4,780,616 10/1988 Nishi et al. ........................... 356/400

Primary Examiner—David C. Nelms
Assistant Examiner—William L. Oen
Attorney, Agent, or Firm—Shapiro and Shapiro

[57] ABSTRACT

A device for detecting the levelling of an object disposed on a plane substantially perpendicular to the optic axis of main objective optical means and worked by a radiation beam from the main objective optical means comprises levelling detecting optical means including an irradiating optical system for supplying a collimated light beam to a particular area of the surface of the object from an oblique direction, and a condensing optical system having light receiving means and for condensing the light beam reflected by the particular area on the light receiving means, and field stop means providing a plurality of stop openings differing in shape from one another, the field stop means being disposed in the levelling detecting optical means, one stop opening corresponding to the shape of the particular area being selected from among the plurality of stop openings.

7 Claims, 6 Drawing Sheets

DEVICE FOR DETECTING THE LEVELLING OF THE SURFACE OF AN OBJECT

BACKGROUND OF THE INVENTION

1. Field of the Invention

This invention relates to a device for accurately installing the surface of a planar object such as a semiconductor wafer perpendicularly to the optic axis of an object lens, and in particular to a device for detecting the levelling of the surface of an object.

2. Related Background Art

In the lithography process in the manufacture of semiconductive integrated circuits, use is made chiefly of a reduction projection type exposure apparatus using the step-and-repeat system, i.e., a so-called stepper, and circuit patterns formed on a mask or a reticle (hereinafter referred to as the reticle) are successively exposed onto a wafer which is a piece to be worked through a projection objective lens (hereinafter simply referred to as a projection lens). A projection lens having a great numerical aperture (N.A.) is generally used in this stepper and therefore, the allowed focus range is very small. So, in order to accomplish the exposure of clear-cut patterns over the entire exposure area on the wafer, the center or a marginal point of the exposure area is usually detected for each exposure area by the use of an auto focus mechanism, and the exposure area is moved in the direction of the optic axis of the projection lens so as to be perpendicular to the optic axis of the projection lens. Recently, however, the numerical aperture (N.A.) of the projection lens is further increased correspondingly to the minimum line width of a circuit formed in the order of sub-micron, and an inclination relative to the imaging plane of the projection lens occurs in the other area than the detected point on the exposure area by the auto focus mechanism, and the occurrence of partial focus deviation in the exposure area caused by this inclination poses a problem. Therefore, it is necessary to maintain the surface of the exposure area perpendicular to the optic axis of the projection lens. As a conventional device for detecting the horizontal, there is a collimator type "horizontal position detecting device" as disclosed, for example, in U.S. Pat. No. 4,558,949. This horizontal position detecting device includes an irradiating optical system for supplying a parallel light flux emitted from a minute opening to an area of the surface of an object from a direction oblique relative to the optic axis of a main objective lens, and a condensing optical system for condensing on a light receiving element the light flux supplied from said irradiating optical system and reflected by said area, the optic axes of said two optical systems being disposed symmetrically with respect to the optic axis of said main objective lens, and whether said area is perpendicular to the optic axis of the main objective lens is discriminated from the output of the light receiving element, whereby the levelling of the surface of the object is detected.

In such a levelling detecting device, it is often the case that the shape of the detection area on the surface of the object is fixed and that shape is generally a circular area inscribed or circumscribed with the area.

The conventional projection exposure apparatus carrying thereon a levelling detecting device in which the detection area is fixed as described above has suffered from the following problem. When the outer edge portion of a wafer is exposed, a part of the exposure area sometimes protrudes from the wafer. At this time, the levelling detecting device detects the horizontal of a partly vacant area. However, such outer edge portion of the wafer often has its surface inclined. Particularly, where pattern lithography having a plurality of chip patterns in one projection exposure area is carried out, when there is a chip pattern exposed in a perfect form on the wafer without protruding from the wafer even in the case of exposure in which the part as described above protrudes from the wafer, it is required in manufacturing efficiency to make the most of that chip pattern. In such a case, the inclination of the surface of the outer edge portion of the wafer as described above adversely affects the detection of the horizontal.

SUMMARY OF THE INVENTION

It is a primary object of the present invention to provide a device which can detect the levelling of the surface of an object highly accurately.

It is another object of the present invention to provide a device which, even in the case of the detection of the levelling of a surface area including the circumference of an object, can accomplish highly accurate detection by coping with the area and shape of the surface area.

It is still another object of the present invention to provide a levelling detecting device which is high in detection sensitivity.

A levelling detecting device according to an embodiment of the present invention is provided with a field stop for changing the shape of the detection area correspondingly to the surface area of an object.

Thereby, it becomes possible both to set the detection area in a horizontal position with the entire exposure area as a subject and to set the detection area in a horizontal position correspondingly to one or plural chip pattern area which are a portion in the exposure area.

Specifically, where all of the exposure area is fully on a wafer as in a case where, for example, the central portion of the wafer is exposed, the detection area is set to the entire exposure area, and where a part of the exposure area protrudes from the outer edge of the wafer as in a case where the area including the outer edge portion of the wafer is exposed, the detection area is set correspondingly to only the chip pattern projection are lying fully on the wafer.

DESCRIPTION OF THE PREFERRED EMBODIMENTS

Figure 1:
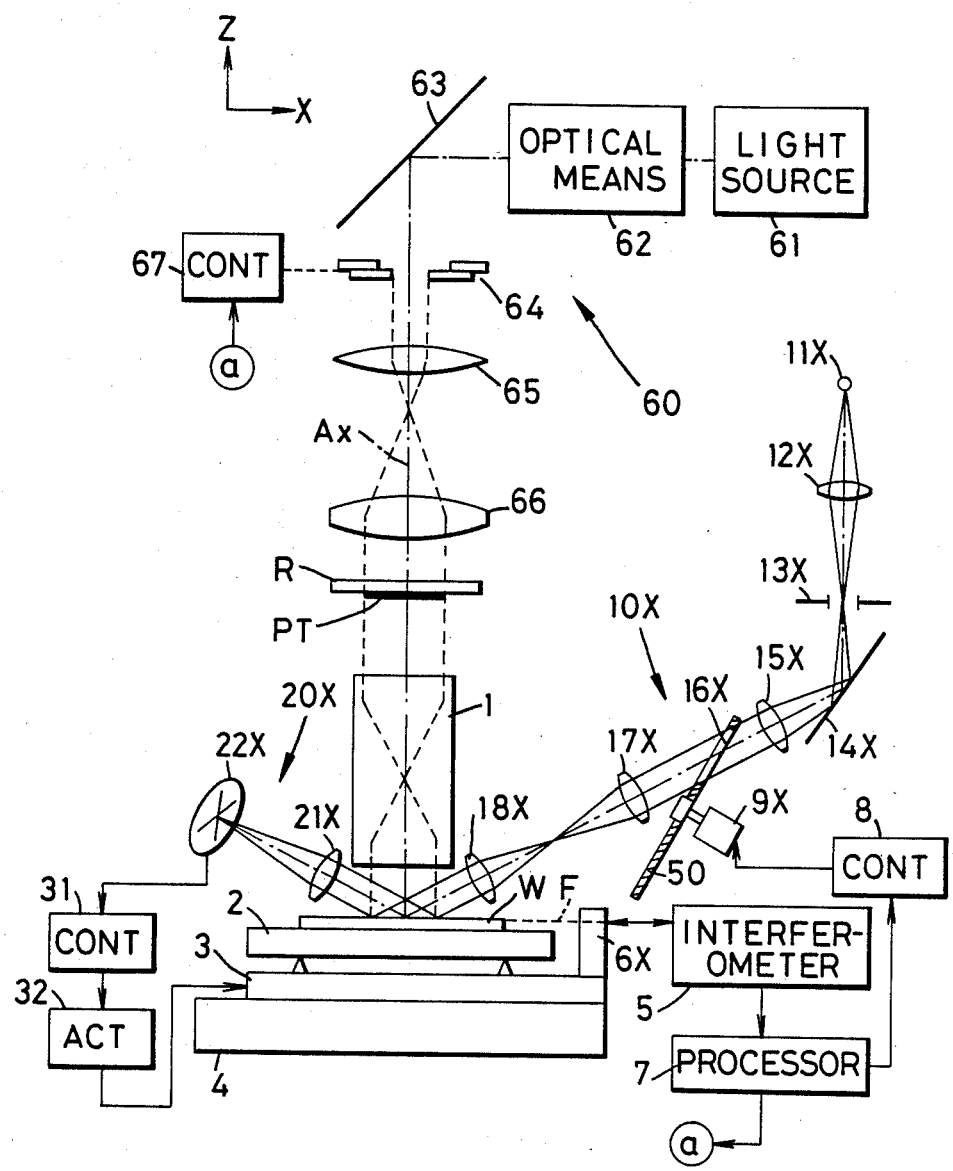
FIG. 1 schematically shows the construction of a first embodiment of the present invention.

In FIG. 1, a both-side or one-side telecentric projection lens 1 having an optic axis AX perpendicular to the XY movement plane (the coordinates system XY) of a wafer W reduces the image of a circuit pattern formed on the pattern area PT of a reticle R to 1/5 or 1/10, and forms the projected image thereof on the imaging plane of the projection lens 1. This imaging plane is coincident with a predetermined reference plane F (parallel to the coordinates system XY). The projection lens 1 used in the present embodiment is an optical system telecentric on both of the reticle side and the wafer side.

Figure 2:
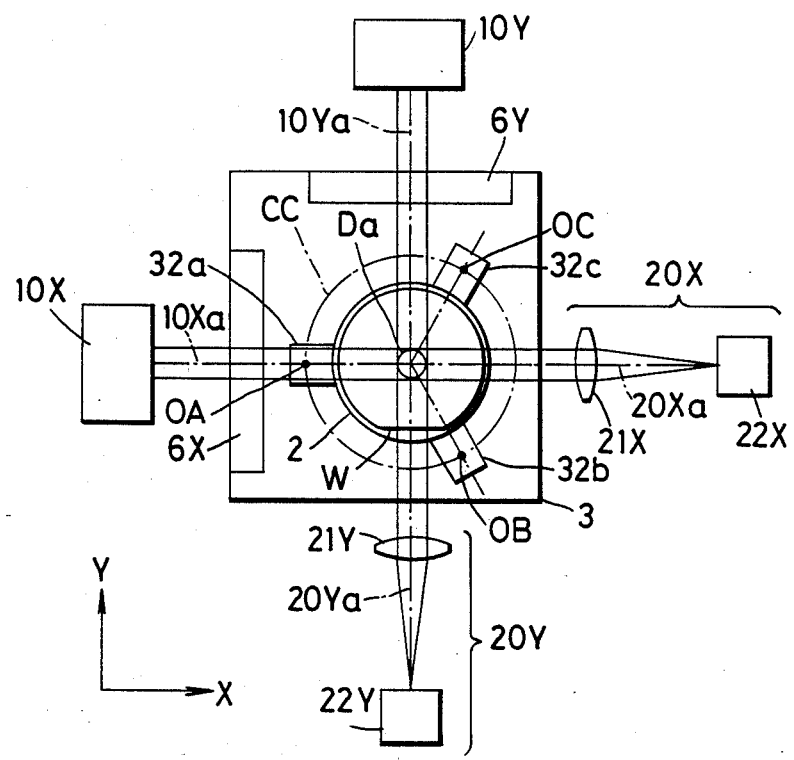
FIG. 2 schematically shows the disposition of first and second levelling detection systems.

Now, the wafer W to be exposed is held on a tilting stage 2 inclinable in any direction with respect to the reference plane (hereinafter referred to as the levelling stage) through a wafer holder (a $\theta$ table), not shown. The construction, etc. of the levelling stage are disclosed, for example, in U.S. Pat. No. 4,770,531. An actuator 32, as shown in FIG. 2, includes actuating portions 32a, 32b and 32c disposed on a Z stage 3 at an angle of about 120° with respect to the center of the levelling stage 2 on which the wafer is placed, and these actuating portions are individually given to control the inclination of the levelling stage 2. The levelling stage 2 is provided on the Z stage 3, which in turn is provided on an X-Y stage 4 movable in directions X and Y along the reference plane F. The Z stage 3 is designed to be moved only in direction Z (the direction of the optic axis AX) relative to the X-Y stage 4, and a plane mirror 6X for a laser interferometer 5 for effecting the detection of the position of the X-Y stage 4 in direction X is provided on one end portion of the Z stage 3. A laser interferometer and a plane mirror for effecting the detection of the position of the X-Y stage 4 in direction Y (the value of the Y coordinates) are likewise provided, but only the plane mirror 6Y is shown in FIG. 2.

The value of the X, Y coordinates of the X-Y stage 4 measured by these laser interferometers is supplied to a processor 7. Necessary data such as the diameter of the wafer and the arrangement map of the exposure area on the wafer are pre-stored in the processor 7, and a suitable field stop is selected correspondingly to the position of the exposure area, and the information thereof is output to a controller 8.

Now, a collimator type first levelling detection system (LDS) having an irradiating optical system 10x and a condensing optical system 20x shown in FIG. 2 is disposed with the optic axes 10xa and 20xa of the two optical system being symmetrical with respect to the optic axis AX of the projection lens 1, and is provided so that the incidence surface of the first LDS (the plane containing the optic axes 10xa, 20xa and AX) is parallel to the X-axis of the coordinates system XY.

As shown in FIG. 1, the irradiating optic system 10x is comprised of a light source 11x, a condenser lens 12x, a stop 13x having a minute circular opening, a mirror 14x, a first relay lens 15x, a field stop 16x for arbitrarily setting the shape of the detection area on the wafer, a second relay lens 17x and an irradiating objective lens 18x. The image of the light source 11x is formed on the stop 13x by the condenser lens 12x, and further, a light flux collimated by the first relay lens 15x having a focus on the stop 13x is supplied to the field stop 16x.

Figure 3:
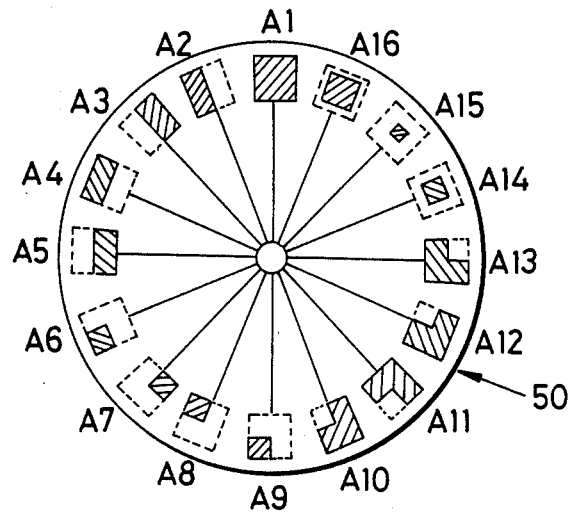
FIG. 3 is a plan view showing a field stop plate.

The field stop 16x is comprised of a stop disk 50 as shown, for example in FIG. 3 and can vary the side and shape of the stop. A plurality of stop openings (indicated by hatching) A1–A16 differing in shape from one another are formed around the stop disk 50, and when the disk 50 is rotated about a shaft extending through the center thereof by an actuator 9x, the stop opening on the optical path varies. The shape of the detection area can be arbitrarily set correspondingly to the position and shape of the exposure area. The second relay lens 17x and the irradiating objective lens 18x are disposed at such positions that the rearward focus of the second relay lens 17x and the forward focus of the irradiating objective lens 18x are coincident with each other, and the collimated light flux is also supplied onto the wafer.

The imaging plane of the projection lens 1 and the field stop 16x are at a conjugate position, and more specifically, the field stop 16x is disposed at the forward focus position of the second relay lens 17x and the irradiating objective lens 18x is disposed so that the rearward focus position thereof coincides with the imaging plane. Assuming that in this case, the second relay lens 17x and the irradiating objective lens 18x are of the same focal length, the image of the field stop 16x is formed at one-to-one magnification on the imaging plane.

The light supplied from the irradiating optical system 10x is a light of a wavelength distribution differing from that of the exposure light in order not to sensitize the photoresist on the wafer, and in the present embodiment, use is made of a polychromatic light particularly to reduce the thin film interference by the photoresist.

The condensing optical system 20x is comprised of a light receiving objective lens 21x and a light receiving element 22x such as a two-divided light receiving element, a four-divided light receiving element as shown in the aforementioned U.S. Pat. No. 4,558,949 or a one-dimensional position detecting element (PSD). The light flux supplied from the irradiating optical system 10x is reflected by the exposure area on the wafer, and is condensed on the light receiving element 22x provided on the focal plane of the light receiving objective lens 21x by the light receiving objective lens 21x. This light receiving element 22x is provided at such a position that the light flux from the irradiating optical system 10x is condensed at the central position of the light receiving element 22x when the inclination of the imaging plane of the reticle R by the projection lens 1 and the inclination of the upper surface of the wafer coincide with each other.

Since a minute rectangular pattern is formed with a certain degree of regularity on the circuit pattern formed on the wafer W, a diffracted light may be created in addition to the direct reflected light of the irradiating light flux. So, in the present embodiment, although not shown in particular, an aperture stop and a condenser lens may be provided between the light receiving objective lens 21x and the light receiving element 22x to remove the diffracted light and reduce the occurrence of noise in the light receiving element 22x.

Also, as shown in FIG. 2, the second LDS comprises an irradiating optical system 10Y and a condensing optical system 20Y, and is provided so that the optic axes 10Ya and 20Ya of the two optical systems are disposed symmetrically with respect to the optic axis AX of the projection lens 1 and the incident surface (the plane containing the optic axes 10Ya, 20Ya and AX) of the second LDS is parallel to the Y-axis of the coordinates system XY. The irradiating optic system 10Y and the condensing optical system 20Y are identical in construction to the above-described irradiating optical system 10x and condensing optical system 20x, respectively, and therefore need not be described.

Above the reticle R, there is provided an illuminating device 60 including a light source 61 outputting the exposure light, an optical system 62 including a fly-eye lens and a condenser lens, a reflecting mirror 63, an optical blind 64, a relay lens 65, a condenser lens 66 and a blind controller 67.

The light output from the light source 61 once illuminates the blind 64 through the optical system 62, and further illuminates the reticle R through the relay lens 65 and the condenser lens 66.

The optical blind 64 is disposed at a position conjugate with the pattern surface PT of the reticle with respect to the optical system comprising the relay lens 65 and the condenser lens 66. This blind 64 is constructed so as to be capable of forming any rectangular opening, for example, by four rectangular movable blades, and can set the exposure area to any rectangular area.

The operation of the present embodiment will now be described. The processor 7 detects the position of the exposure area on the wafer in direction X by the laser interferometer 5. Likewise, it also detects the position of the exposure area in direction Y by a laser interferometer, not shown, judges the shape of the exposure area on the basis of the value of the X, Y coordinates and information such as the pre-input diameter of the wafer and the arrangement map of the exposure area, and selects an optimum field stop conforming to the shape of the exposure area with respect to each of the first LDS and the second LDS from among the stop openings A1–A16 in the following manner.

Figure 4:
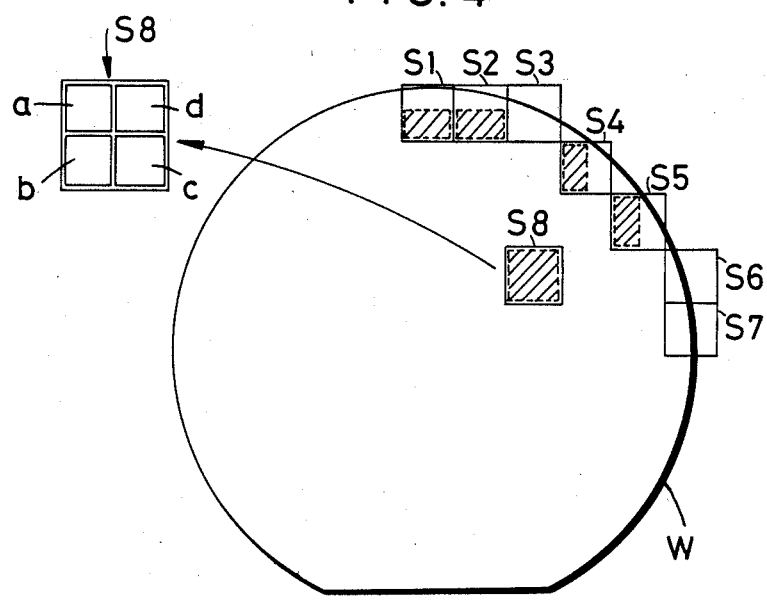
FIG. 4 shows the arrangement of chips on a wafer.

FIG. 4 shows an example of the arrangement of exposure areas on the wafer. Designated by S1–S8 are the exposure areas. The pattern of the reticle R is provided so that for example, four dispatterns are arranged in each exposure area, that is, chip patterns a, b, c and d are formed in the exposure area S8, whereby four IC chips may be obtained at a time from one exposure area.

For example, the exposure area S8 has its whole positioned fully on the wafer. When this area S8 is to be exposed, the detection areas of the first and second LDS's can be set to a square which will coincide with the entire exposure area as indicated by hatching. Accordingly, in this case, the stop opening A1 on the stop disk is selected.

Next, where the outer edge of the wafer is contained in the exposure area, for example, where the exposure area is at the position of S1 or S2, only the chip patterns b and c are completely obtained and the chip patterns a and b deviate from the wafer. In the areas corresponding to these chip patterns a and b, the planarity of the wafer is bad and these areas should be excluded from tee object of levelling detection. Consequently, in this case, the stop opening A5 is selected.

For the same reason, where the exposure area is at the position of S4 or S5, the stop opening A2 is selected.

Where the exposure area is at the position of S3, S6 or S7, there is no chip pattern completely formed on the wafer and therefore, the levelling detection operation is omitted.

When the optimum stop opening is selected, the processor 7 then outputs this information to the controller 8, which in turn outputs the selected data to the actuator 9x. The actuator 9x rotates the stop disk 50 on the basis of the selected data, and rotatively positions the selected stop opening at the stop position. Likewise, in the second LDS, the selected stop opening is rotatively positioned at the stop position on the basis of the selected data from the controller.

After the setting of this optimum stop opening is terminated, the first and second LDS's apply collimated light fluxes onto the exposure area, and the light fluxes reflected by this exposure area are individually received by the light receiving elements 22x and 22y. The light receiving elements 22x and 22y output to the controller 31 the deviation information of the direction and amount of displacement of the condensing point occurring on the light receiving elements 22x and 22y correspondingly to the inclination of the exposure area.

On the basis of this information, the controller 31 finds the angles of inclination $\theta x$ and $\theta y$ of the exposure area in the direction of the X-axis and the direction of the Y-axis with respect to the imaging plane, in the manner described in detail hereinafter.

Figure 5:
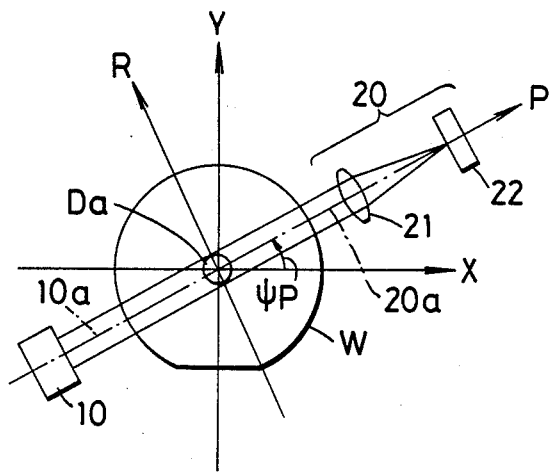
FIG. 5 shows one of the levelling detection systems on XY plane.

It is to be understood that as shown in FIG. 5, the LDS comprising the irradiating optical system 10 and the condensing optical system 20 is provided at a position rotated by an angle $\phi p$ from the X-axis in the orthogonal coordinates system XY with respect to the optic axis of the projection lens. The direction along the incidence surface with respect to the coordinates system XY is the direction of P-axis, the direction perpendicular to the incidence surface is the direction of R-axis, the direction along the line of intersection between the light receiving surface and the incidence surface on the light receiving surface of the light receiving elements 22 is a direction p, and the direction perpendicular to the direction p is a direction r.

Now, if the exposure area keeps perpendicularity to the optic axis of the projection lens, the light flux reflected by the exposure area is condensed at the center of the light receiving elements 22 (the point of intersection between the direction p and the direction r), and if the exposure area is inclined by $\alpha$ from the perpendicular, the reflected light flux is inclined by $2\alpha$ with respect to the optic axis 20a of the condensing optical system 20 and therefore, correspondingly thereto, is condensed at a position off the center of the light receiving elements 22.

In response to the rotation of the exposure area in the directions of the P-axis and the R-axis, the condensing point changes its position on the light receiving elements 22. The amounts of displacement $\Delta P$ and $\Delta R$ of this condensing point in the direction p and the direction r are detected. Subsequently, the angles of inclination $\theta p$ and $\theta r$ of the exposure area in the directions of the P-axis and the R-axis with respect to the imaging plane of the projection lens are calculated from the amounts of displacement $\Delta P$ and $\Delta R$ of the condensing point by the use of the following equations (1) and (2). The focal length of the condensing optical system 20, i.e., the light receiving objective lens 21, is f, and the angle formed by the light flux supplied onto the exposure area by the irradiating optical system 10 with respect to the exposure area surface is $\theta s$.

$$\Delta P = f \cdot \tan(2\theta p) \qquad (1)$$

$$\Delta R = f \cdot \tan(2\theta r) \cdot \cos(90° - \theta s) \qquad (2)$$

Here, the numerical apertures NAp and NAr and the depths of focus FDp and DRr on the surfaces of the light receiving elements 22 in the direction p and the direction r can be calculated by the use of the following equations (3)–(6), and the amounts of displacement $\Delta P$ and $\Delta R$ of the condensing point are detected under this condition. The cross-sectional shape of the light flux supplied by the irradiating optical system 10 is assumed to be circular, the radius on the detection area Da thereof is a, and the central wavelength is $\lambda$.

$$NAp = 2 \cdot \sin\theta s / f \quad (3)$$

$$NAr = a/f \quad (4)$$

$$FDp = \pm \frac{1}{2} \cdot \frac{\lambda}{(NAp)^2} \quad (5)$$

$$FDr = \pm \frac{1}{2} \cdot \frac{\lambda}{(NAr)^2} \quad (6)$$

On the basis of the angles of inclination $\theta p$ and $\theta r$ calculated from the aforementioned equations (1) and (2), control means generates control data conforming to the angles of inclination $\theta p$ and $\theta r$, and the stage on which the wafer is placed is moved by the actuator so as to correct the inclination of the surface of the exposure area of the wafer, and the exposure area is automatically set at an averagely accurate position perpendicular to the optic axis of the projection lens.

The direction of inclination of the exposure area is represented by the normal unit vector $\vec{a}$ primarily determined by the angle of inclination $\theta$ from the Z-axis shown in FIG. 6 and the angle (hereinafter referred to as the azimuth angle) $\phi$ from the X-axis of the image projected onto the XY plane. So, if the angles of inclination of the exposure area relative to the imaging plane of the projection lens are $\theta x$ and $\theta y$ with respect to the directions of the X-axis and the Y-axis, respectively, the angle of inclination $\theta$ and the azimuth angle $\phi$ are represented by equations $\theta x = \theta \cdot \cos$ and $\theta y = \theta \cdot \sin\phi$. Accordingly, if the angles of inclination $\theta x$ and $\theta y$ are calculated from the angles of inclination $\theta p$ and $\theta r$ calculated from the equations (1) and (2) by the use of the following equations (7) and (8), the azimuth angle $\phi$ and the angle of inclination $\theta$ can be determined.

$$\theta x = \theta p \cdot \cos \phi p + \theta r \cdot \cos(\phi p + 90°) \quad (7)$$

$$\theta y = \theta p \cdot \sin \phi p + \theta r \cdot \sin(\phi p + 90°) \quad (8)$$

As a result, the normal unit vector $\vec{a}$, i.e., the direction of inclination of the exposure area relative to the imaging plane of the projection lens, can be determined.

As is apparent from the above-mentioned equations (3)–(6), on the light receiving elements 22, the numerical aperture NAr in the direction r becomes great relative to the numerical aperture NAp in the direction p and along therewith, the depth of focus FDr becomes shallow relative to the depth of focus FDp. For example, when the numerical aperture NAp and NAr are calculated by the use of the radius of the detection area Da $a = 7.5$ mm, the focal length of the condensing optical system 20 $f = 100$ mm, the central wavelength $\lambda = 800$ nm and the angle $\theta s = 20°$ formed by the parallel light flux with respect to the exposure area surface as the representative design values of such an apparatus, $NAp = 0.026$ and $NAr = 0.075$. Likewise, the depths of focus are $FDp \approx \pm 608$ $\mu$m and $FDr \approx \pm 71$ $\mu$m. It is seen from this result that the depth of focus in the direction r becomes very shallow as compared with the depth of focus in the direction p.

Also, when detection of the inclination of the exposure area in which the angles of inclination in the directions of the P-axis and the R-axis are equal to each other is to be effected, assuming that in the equations (1) and (2), the angle formed by the parallel light flux with respect to the exposure area surface is $\theta s = 20°$, the ratio between the amounts of displacement of the condensing point on the light receiving elements 22 in the direction p and the direction r is $\Delta P : \Delta R \approx 1 : 0.34$. That is, the amount of displacement $\Delta R$ of the condensing point in the direction r is small as compared with the amount of displacement $\Delta P$ of the condensing point in the direction p, and the detection sensitivity in the direction r is low.

By the utilization of these natures, in the present embodiment, two sets of LDS's each comprising an irradiating optical system and a condensing optical system are provided along the direction of the X-axis and the Y-axis of the coordinates system XY, and the angles of inclination of the exposure area in the directions of the X-axis and the Y-axis are detected in the direction along the line of intersection between the light receiving elements. Thereby, the focusing of the light receiving elements can be easily accomplished in a direction in which the numerical aperture is great (a direction perpendicular to the line of intersection). The angle of inclination of the exposure area is not detected in the direction perpendicular to the line of intersection and therefore, the detection sensitivity of the light receiving elements can be substantially enhanced and further, the occurrence of the detection error by focus deviation can be prevented.

The controller 31 determines the angles of inclination $\theta x$ and $\theta y$ by the use of the above-mentioned equation (1) from the amounts of displacement $\Delta X$ and $\Delta Y$ of the condensing point detected by the light receiving elements 22x and 22y. Subsequently, the controller 31 generates control data corresponding to the angles of inclination $\theta x$ and $\theta y$, and outputs the control data to the actuator 32. The actuator 32 displaces the driving portions 32a, 32b and 32c of the levelling stage 2 in the direction Z (the direction of the optic axis AX) in accordance with the control data, and brings the exposure area of the wafer into accurate coincidence with the imaging plane (the reference plane F) of the projection lens.

Figure 6:
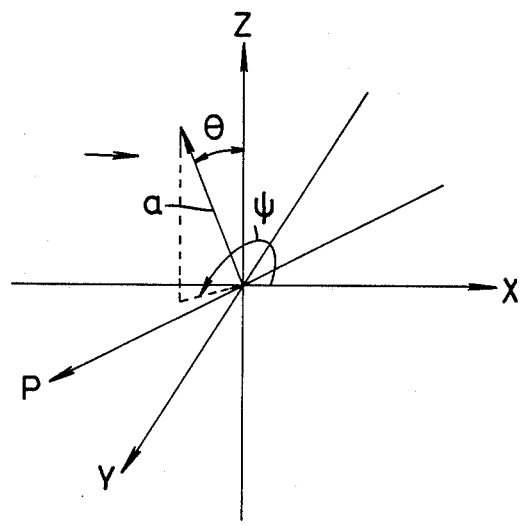
FIG. 6 shows the normal unit vector $\vec{a}$ representing the direction of inclination of the exposure area.

The control data may be prepared by finding the azimuth angle $\phi$ and the angle $\theta$ from the angles of inclination $\theta x$ and $\theta y$ calculated from the amounts of displacement $\Delta X$ and $\Delta Y$ of the condensing point by the use of the equation (1) and the equations that $\theta x = \theta \cdot \cos\phi$ and $\theta y = \theta \cdot \sin\phi$, and on the basis of the normal unit vector $\vec{a}$ as shown in FIG. 6.

In the case of the present embodiment, if two-divided light receiving elements divided into two at the center thereof in the direction r are used as the light receiving elements 22x and 22y, simple processing will only be required in preparing the control data.

The disposition of the first and second LDS's used in the present embodiment need not be along with the X-axis and the Y-axis as in the above-described construction, but what is essential is to dispose them so that the line of intersection between the incidence surface of the first LDS and the incidence surface of second LDS coincides with the optic axis of the projection lens.

Figure 7:
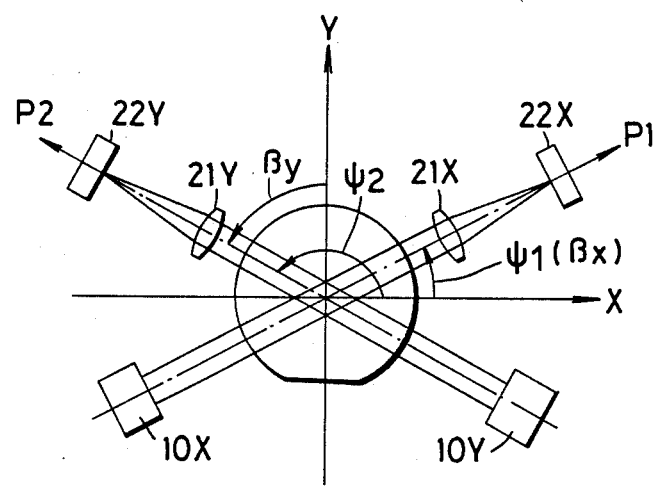
FIG. 7 schematically shows the disposition of first and second levelling detection systems according to another embodiment.

For example, as shown in FIG. 7, the first and second LDS's are disposed at positions rotated from the X-axis by $\phi_1$ and $\phi_2$, respectively. In this case, in conformity with the inclinations of the exposure area in the directions of the $P_1$-axis and the $P_2$-axis, the condensing point positionally deviates from the center on the two-divided light receiving element $22x$ and $22y$. So, the amounts of displacement $\Delta P_1$ and $\Delta P_2$ of the condensing point in the direction along the line of intersection between the light receiving surface and the incidence surface are detected by an operation similar to what has been described above. Then, the angles of inclination $\theta_1$ and $\theta_2$ of the exposure area in the directions of the $P_1$-axis and the $P_2$-axis are calculated, and the angles of inclination $\theta x$ and $\theta y$ of the exposure area in the directions of the X-axis and the Y-axis are found as control data by the use of the following equations (9) and (10):

$$\theta x = \frac{1}{\cos\phi_1 \cdot \sin\phi_2 - \sin\phi_1 \cdot \cos\phi_2} \times (\theta_1 \cdot \sin\phi_2 - \theta_2 \cdot \sin\phi_1) \quad (9)$$

$$\theta y = \frac{1}{\cos\phi_1 \cdot \sin\phi_2 - \sin\phi_1 \cdot \cos\phi_2} \times (-\theta_1 \cdot \cos\phi_2 + \theta_2 \cdot \cos\phi_1) \quad (10)$$

Or, if the azimuth angle $\phi$ of the normal unit vector $\vec{a}$ primarily representing the direction of inclination of the exposure area shown in FIG. 6 and the angle of inclination $\theta$ from the Z-axis are determined from the angles of inclination $\theta x$ and $\theta y$ found from the equation (9) and (10) and the equations that $\theta x = \theta \cdot \cos\phi$ and $\theta y = \theta \cdot \sin\phi$, the direction of inclination of the exposure area can be detected.

Figure 8:
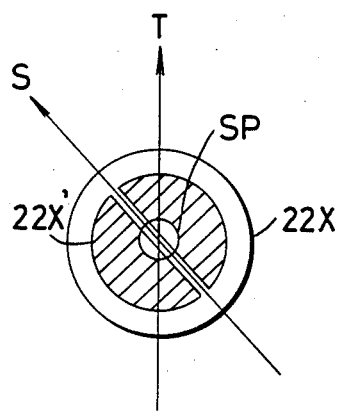
FIG. 8 is a plan view of a two-divided light receiving element.

Further, where the first and second LDS's are disposed at positions rotated by any angles $\phi_1$ and $\phi_2$ from the X-axis, the relative positional relation between the direction of division (direction S) of the light receiving surface $22x'$ of the two-divided light receiving element $22x$ shown in FIG. 8 and the direction along the line of intersection between the light receiving surface $22x'$ and the incidence surface Px (direction T) is changed (rotated) in conformity with the angle $\beta x(=\phi_1)$ of the direction of the $P_1$-axis of FIG. 7 (the incidence surface Px) from the X-axis. If adjustment is done thus, it is also possible to determine the angle of inclination $\theta x$ directly from the output information of the two-divided light receiving element without calculating the angle of inclination $\theta x$ in the direction of the X-axis from the angle of inclination $\theta_1$.

Likewise, if the relative positional relation between the direction of division on the light receiving surface of the two-divided light receiving element and the direction along the line of intersection between the light receiving surface and the incidence surface Py is changed (rotated) in conformity with the angle $\beta y(=\phi_2-90°)$ of the direction $P_2$ (the incidence surface Py) from the Y-axis, the angle of inclination $\theta y$ can be determined without calculating the angle of inclination $\theta_2$.

Figure 9:
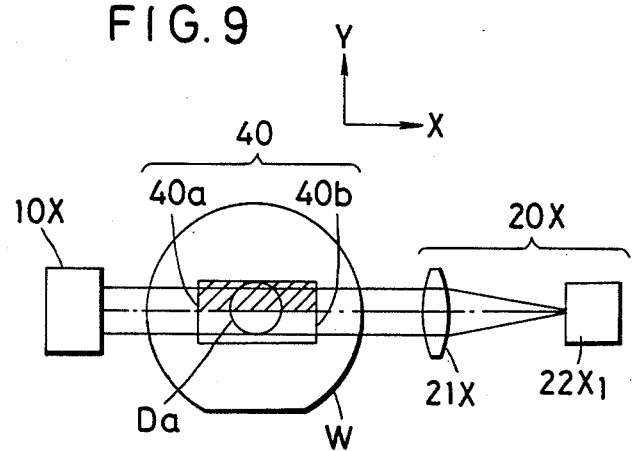
FIG. 9 is a plan view showing an example for the focusing of the levelling detection systems.
Figure 10:
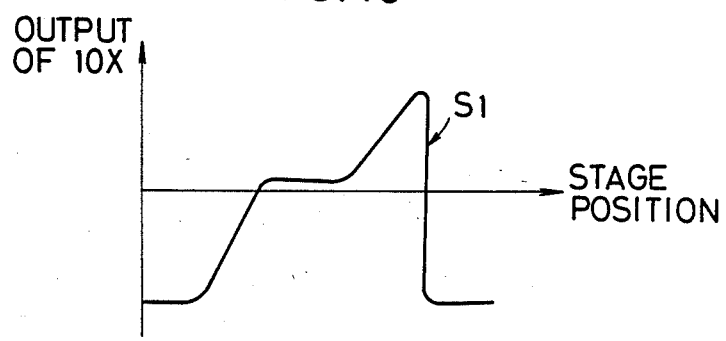
FIGS. 10 and 11 are graphs showing the outputs of light receiving elements.
Figure 11:
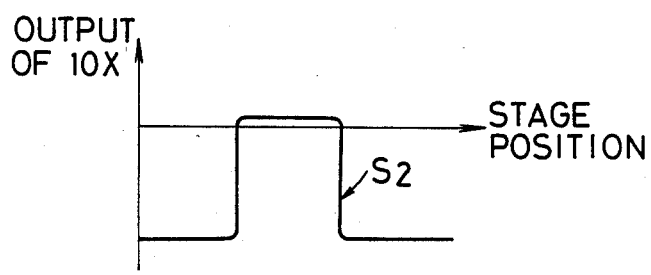

Also, where four-divided light receiving elements are used as the light receiving elements, a construction as described below may be adopted. A planar thin film object 40 provided with a high reflectance area 40a and a low reflectance area 40b is provided on the wafer W, as shown in FIG. 9. The wafer is then moved in a direction perpendicular to the incidence surface, i.e., the direction Y, so that the collimated light flux from the irradiating optical system 10x irradiates the high reflectance area 40a and the low reflectance area 40b in succession. When focus deviation is occurring, the output from the light receiving element $22x_1$ in a direction perpendicular to the line of intersection between the light receiving surface and the incidence surface assumes a wave form $S_1$ as shown in FIG. 10. Accordingly, by adjusting the position of the light receiving element $22x_1$ until this output signal $S_1$ assumes a wave form $S_2$ as shown in FIG. 11, it becomes possible to accomplish the focusing of the light receiving element $22x_1$ with high accuracy.

In the direction along the line of intersection between the light receiving surface and the incidence surface of the light receiving element $22x_1$, detection of the angle of inclination $\theta x$ of the exposure area in the direction of the X-axis is effected as in the above-described embodiment.

With regard also to the second LDS, an object 40 differing in reflectance in the direction X is provided and the wafer is moved in the direction X to thereby obtain an output, and on the basis thereof, the positions of the light receiving elements are adjusted.

In the above-described embodiment, for example, a variable stop or the like to which the principle of liquid crystal shutter can be utilized as the construction of the variable field stop of the irradiating optical system. In such case, by selectively controlling the dots of liquid crystal two-dimensionally made into picture elements transparently or opaquely, field stops of various shapes and sizes can be made.

We claim:

1. A device for detecting the levelling of an object disposed on a plane substantially perpendicular to the optic axis of main objective optical means and worked by a radiation beam from said main objective optical means, comprising:

levelling detecting optical means including an irradiating optical system for supplying a collimated light beam to a particular area of the surface of said object from an oblique direction, and a condensing optical system having light receiving means and for condensing the light beam reflected by said particular area on said light receiving means; and field stop means providing a plurality of stop openings differing in shape from one another, said field stop means being disposed in said levelling detecting optical means, one stop opening corresponding to the shape of said particular area being selected from among said plurality of stop openings.

2. A device according to claim 1, wherein said irradiating optical system includes a supply source of said light beam, and said field stop means is disposed at a position optically equivalent to said particular area between said supply source and said light receiving means.

3. A device according to claim 2, wherein said field stop means is provided in said irradiating optical system.

4. A device according to claim 1, wherein said field stop means includes a stop member in which said plurality of stop openings are formed, and means for selecting one of said plurality of stop openings and disposing it in said levelling detecting optical means.

5. A device according to claim 1, further comprising moving means for moving said object relative to said main objective optical means and determining said particular area and wherein said field stop means includes means responsive to said moving means to select one of said plurality of stop openings which has a shape corresponding to said determined particular area.

6. A device according to claim 1, further comprising means responsive to said light receiving means to determine the levelling of said particular area.

7. A device for detecting the levelling of an object disposed on a plane substantially perpendicular to the optic axis of main objective optical means, comprising:

a first levelling detection system having a first irradiating optical system for supplying a collimated first light beam to a particular area of the surface said object from a direction oblique relative to the optic axis of said main objective optical means, and a first condensing optical system for condensing on first light receiving means the first light beam supplied from said first irradiating optical system and reflected by said particular area, the optic axis of said first irradiating optical system and the optic axis of said first condensing optical system being disposed symmetrically with respect to the optic axis of said main objective optical means, said first levelling detection system detecting the inclination of said particular area relative to a reference plane with respect to a first direction on said reference plane;

a second levelling detection system having a second irradiating optical system for supplying a collimated second light beam to said particular area from a direction oblique relative to the optic axis of said main objective optical means, and a second condensing optical system for condensing on second light receiving means the second light beam supplied from said second irradiating optical system and reflected by said particular area, the optic axis of said second irradiating optical system and the optic axis of said second condensing optical system being disposed symmetrically with respect to the optic axis of said main objective optical means, said second levelling detection system detecting the inclination of said particular area relative to said reference plane with respect to a second direction on said reference plane differing from said first direction; and means for determining the levelling of said reference plane on the basis of the inclination of said first direction and the inclination of said second direction.

* * * * *